United States Patent
Kambegawa

(10) Patent No.: US 12,526,926 B2
(45) Date of Patent: Jan. 13, 2026

(54) MULTI-PATTERN SUBSTRATE, FUNCTIONAL MODULE, AND PRODUCTION METHOD FOR FUNCTIONAL MODULE

(71) Applicant: CANON KABUSHIKI KAISHA, Tokyo (JP)

(72) Inventor: Minoru Kambegawa, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 260 days.

(21) Appl. No.: 18/176,767

(22) Filed: Mar. 1, 2023

(65) Prior Publication Data
US 2023/0309239 A1     Sep. 28, 2023

(30) Foreign Application Priority Data

Mar. 22, 2022 (JP) ................... 2022-045408

(51) Int. Cl.
*H05K 3/00* (2006.01)

(52) U.S. Cl.
CPC ... *H05K 3/0052* (2013.01); *H05K 2203/0228* (2013.01); *H05K 2203/302* (2013.01)

(58) Field of Classification Search
CPC ......... H05K 3/0052; H05K 2203/0228; H05K 2203/302
USPC ............................................................ 361/784
See application file for complete search history.

(56) References Cited

U.S. PATENT DOCUMENTS

| | | | | |
|---|---|---|---|---|
| 5,600,101 A | * | 2/1997 | Sakai | H01G 4/232 361/767 |
| 2011/0315439 A1 | * | 12/2011 | Nakashima | H01L 24/97 174/250 |
| 2014/0174803 A1 | * | 6/2014 | Suzuki | H05K 3/0052 174/258 |

FOREIGN PATENT DOCUMENTS

JP     2001326431 A     11/2001

* cited by examiner

*Primary Examiner* — Binh B Tran
(74) *Attorney, Agent, or Firm* — ROSSI, KIMMS & McDOWELL LLP

(57) ABSTRACT

A technique that improves productivity of a functional module on which a component is implemented near an edge. A multi-pattern substrate includes wiring substrate parts, and waste substrate parts provided around the wiring substrate parts integrally. And openings are provided in the waste substrate parts in areas that face components implemented near outer circumferences of the wiring substrate parts.

4 Claims, 7 Drawing Sheets

MULTI-PATTERN SUBSTRATE, FUNCTIONAL MODULE, AND PRODUCTION METHOD FOR FUNCTIONAL MODULE

BACKGROUND OF THE INVENTION

Field of the Invention

The present invention relates to a multi-pattern substrate, a functional module, and a production method for the functional module.

Description of the Related Art

There is a known production method for a functional module that is constituted by implementing electronic components on a small printed substrate (see Japanese Laid-Open Patent Publication (Kokai) No. 2001-326431 (JP 2001-326431A)). In this method, a large printed substrate is partitioned into a plurality of sections by parting lines, a circuit is formed and electronic components are implemented on each section, and then, each section is cut off along the parting lines. When such a production method is employed, a process to implement electric components on a small printed substrate can be performed efficiently in a production process of a functional module.

When the above-mentioned production method for a functional module is used, it is preferable to avoid arranging (implementing) a component near an edge of the small printed substrate because deflection occurs near the edge of the small printed substrate in cutting off the substrate. However, it may be necessary to arrange a component near the edge of the small printed substrate. Examples of such components are an inductor of an antenna, a shielding case, etc.

When a component is arranged near the edge of the small printed substrate, stress due to bending in cutting out the substrate may cause a crack in the component itself or solder that fixes the component to the small printed substrate, which may lower productivity (yield).

SUMMARY OF THE INVENTION

The present invention provides a technique that improves productivity of a functional module on which a component is implemented near an edge.

Accordingly, an aspect of the present invention provides a multi-pattern substrate including wiring substrate parts, and waste substrate parts provided around the wiring substrate parts integrally, wherein openings are provided in the waste substrate parts in areas that face components implemented near outer circumferences of the wiring substrate parts.

According to the present invention, the productivity of the functional module on which a component is implemented near an edge is improved.

Further features of the present invention will become apparent from the following description of exemplary embodiments with reference to the attached drawings.

BRIEF DESCRIPTION OF THE DRAWINGS

FIG. 6A is an expanded plan view showing a part of the multi-pattern substrate in FIG. 5. FIG. 6B is a sectional view of a part of FIG. 6A.

DESCRIPTION OF THE EMBODIMENTS

Figure 1A:
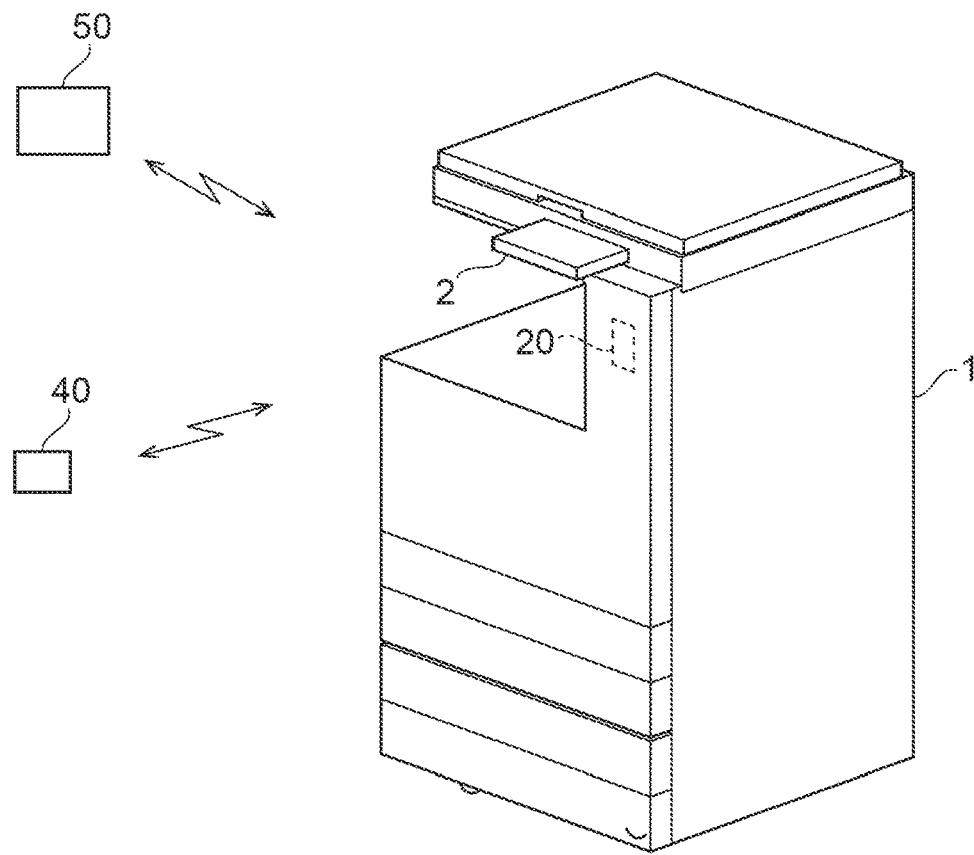
FIG. 1A is an external perspective view showing an image forming apparatus.

Hereafter, embodiments according to the present invention will be described in detail by referring to the drawings. Hereinafter, a wireless LAN module implemented on an image forming apparatus is described as a functional module to which the present invention is applied.

Figure 1B:
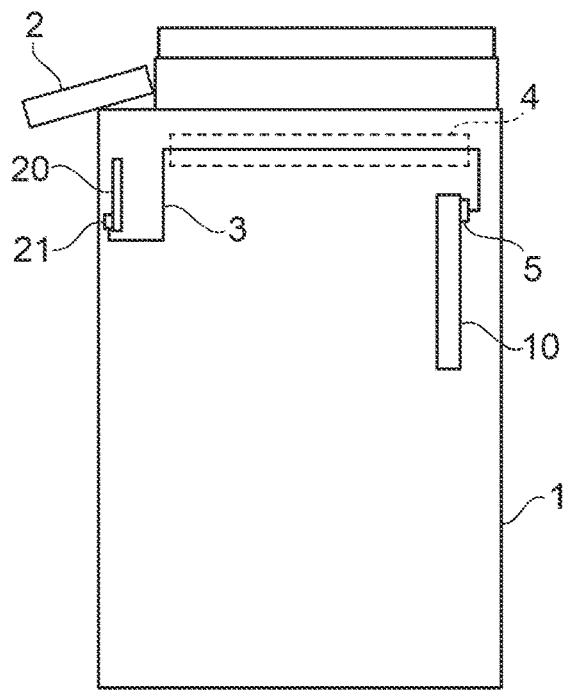
FIG. 1B and FIG. 1C are views briefly showing an internal configuration of the image forming apparatus.
Figure 1C:
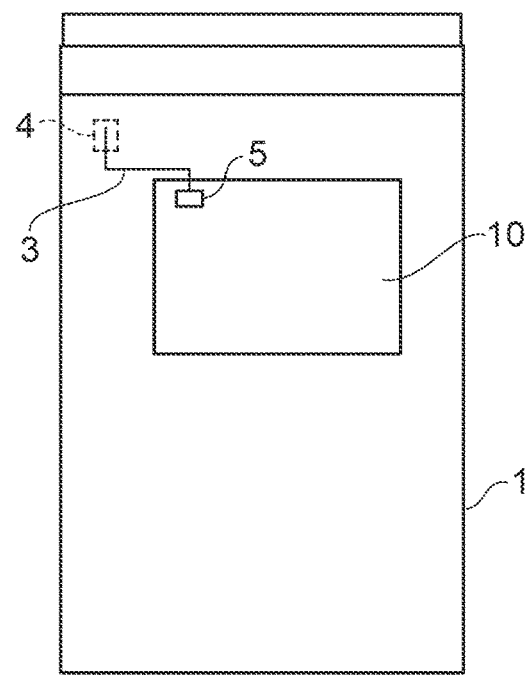

FIG. 1A is a perspective view showing an external appearance of an image forming apparatus 1. FIG. 1B is a view briefly showing an internal configuration of the image forming apparatus 1 viewed from a side surface of the image forming apparatus 1. FIG. 1C is a view briefly showing an internal configuration of the image forming apparatus 1 viewed from a rear side of the image forming apparatus 1.

The image forming apparatus 1 is a multifunction apparatus (MFP) that has a plurality of functions, such as a copy function, a scan function, and a print function, that involve image formation. An operation panel 2 is provided in a front upper portion of the image forming apparatus 1. The operation panel 2 receives user operations, such as various settings of the image forming apparatus 1 and execution instructions of predetermined functions, and displays the execution situation etc. of a job in the image forming apparatus 1.

A wireless LAN module 20 used for wireless communication is attachable to the front side inside the image forming apparatus 1. The wireless LAN module 20 is attached to the image forming apparatus 1 as an option (an extended function) of the image forming apparatus 1 by a serviceperson etc. after installation of the image forming apparatus 1. The wireless LAN module establishes communication channels between the image forming apparatus 1 and devices, such as a wireless LAN access point 50 and a mobile terminal 40, that are placed at positions apart from the image forming apparatus 1 on the basis of a predetermined standard.

A reason why the wireless LAN module 20 is arranged at the front side of the image forming apparatus 1 is because there is a space for a user etc. to operate the image forming apparatus 1 at the front side of the image forming apparatus 1 and the communication channels are easily secured. The mobile terminal 40 may be a smart phone, a tablet PC, or the like.

A USB connector 21 is arranged at the front side inside the image forming apparatus 1. A controller 10 (a control unit) is arranged at the rear side inside the image forming apparatus 1. A USB connector 5 is implemented in the controller 10, and the USB connector 21 and USB connector 5 are electrically connected through a USB cable 3. It should be noted that the USB cable 3 is wired from the rear side to the front side of the image forming apparatus 1 through a cable guide 4.

The wireless LAN module 20 is attached to the USB connector 21. Accordingly, the wireless LAN module 20 is electrically connected with the controller 10 through the USB connector 21, USB cable 3, and USB connector 5 so as to be communicable. In this way, the controller 10 enables transmission and reception of various data through the wireless LAN module 20 with the wireless LAN access point 50 or the mobile terminal 40 according to a procedure based on a predetermined standard.

Figure 2:
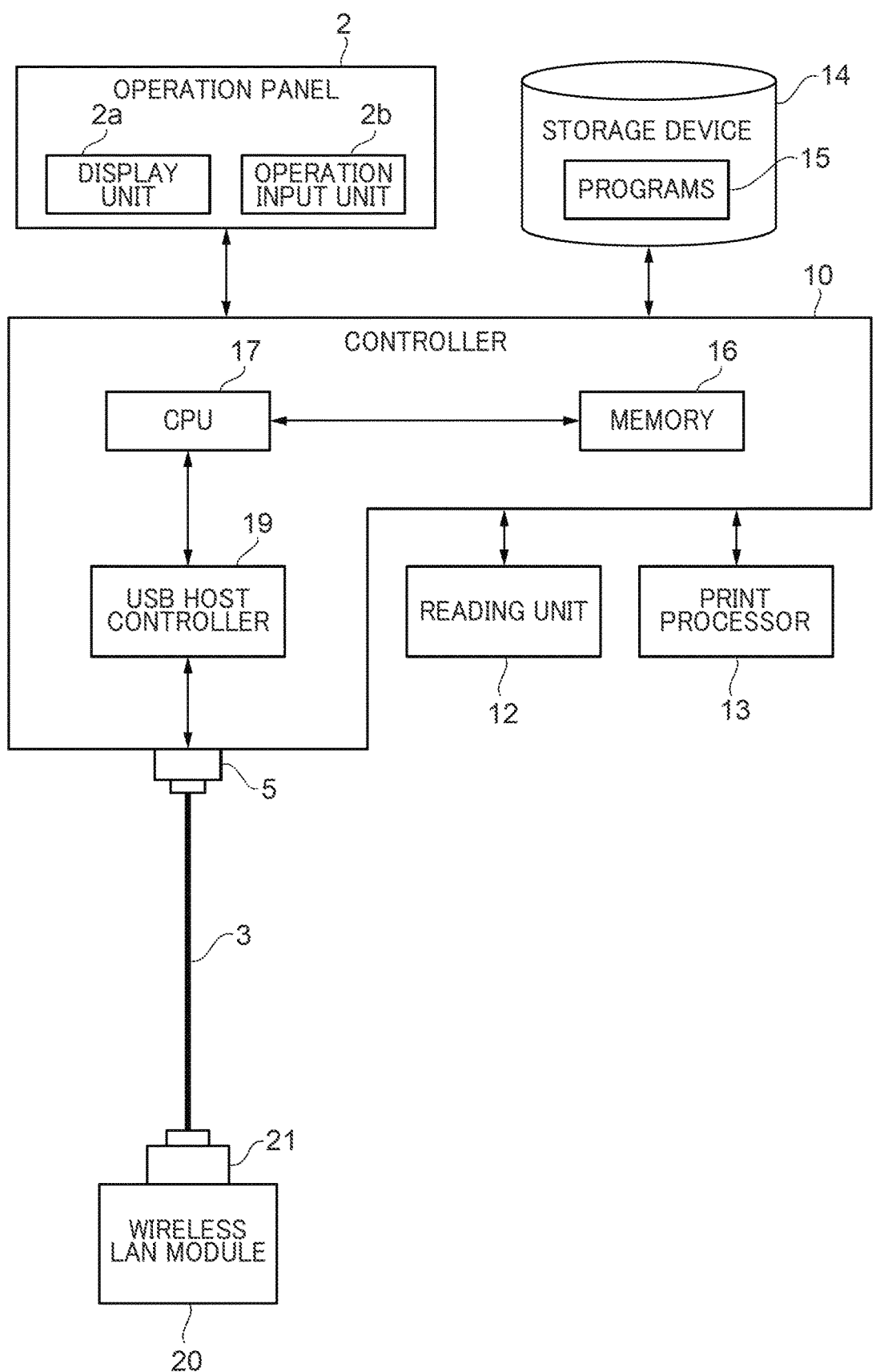
FIG. 2 is a block diagram showing a hardware configuration of the image forming apparatus.

FIG. 2 is a block diagram schematically showing a hardware configuration of the image forming apparatus 1. The image forming apparatus 1 has the operation panel 2, a storage device 14, the controller 10, a reading unit 12, a print processor 13, the USB connectors 5 and 21, the USB cable 3, and the wireless LAN module 20.

The operation panel 2 has a display unit 2a and an operation input unit 2b. The display unit 2a is a display device like a liquid crystal panel that displays various pieces of information. The operation input unit 2b includes a touch panel arranged integrally on a surface of the display unit 2a (a liquid crystal panel etc.) and various input buttons like a ten-key pad. Execution of a process corresponding to a user operation to the operation input unit 2b is instructed to the controller 10.

The reading unit 12 is what is called a scanner, reads an original image optically, and generates image data. It should be noted that the reading unit 12 has an original conveyance unit that conveys originals stacked on an original table one-by-one from the lowermost original and an image data output unit that converts a read original image to generate image data.

The print processor 13 executes a print process to a paper medium (sheet) etc. on the basis of image data and outputs a printed matter. The print processor 13 has an image forming unit that forms a toner image based on image data, a transfer unit that transfers the toner image formed by the image forming unit to a sheet that is fed one-by-one, and a fixing unit that fixes the toner image transferred to the sheet. Moreover, the print processor 13 has a discharge unit etc. that discharges the printed matter to which the fixing process has been applied.

The controller 10 has a CPU 17, a memory 16, and a USB host controller 19. The CPU 17 controls entire operations of the image forming apparatus 1 by running programs 15 that are read from the storage device 14 and are developed to the memory 16. The memory 16 is specifically a RAM and has a temporary data storage area and a work area of the CPU 17. The memory 16 may include a ROM that stores a predetermined program run by the CPU 17.

The USB host controller 19 is connected to the USB connector 5, and the USB connector 5 is electrically connected with the wireless LAN module 20 through the USB cable 3 and USB connector 21 as above-mentioned. When the wireless LAN module 20 is connected to the USB connector 21, the USB host controller 19 can perform data communication based on a USB standard with the wireless LAN modules 20 through the USB connector 5 and USB cable 3. Thereby, the CPU 17 becomes able to control the wireless LAN module 20 through the USB host controller 19. For example, the CPU 17 controls settings of the wireless LAN module 20 and data communication using the wireless LAN module 20.

The storage devices 14 is an HDD (a hard disk drive), a flash memory, or the like, and stores various pieces of information (data) and the programs 15 that the CPU 17 runs. The programs 15 may include a communication control program that is needed to wireless communications using the wireless LAN module 20 even in a case where the wireless LAN module 20 is not attached to the image forming apparatus 1.

Figure 3B:
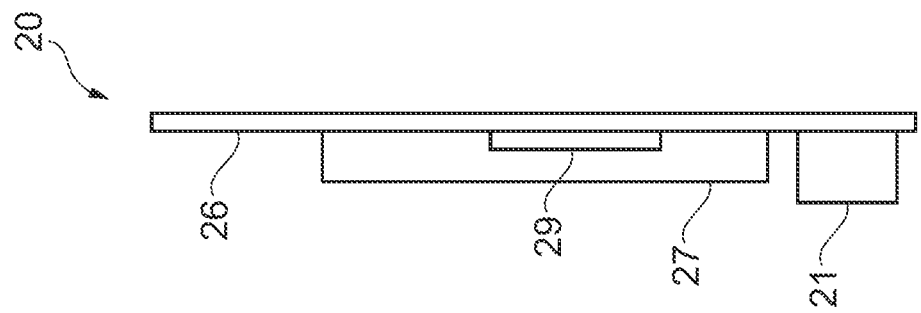
FIG. 3A and FIG. 3B are views schematically showing a configuration of a wireless LAN module.
Figure 3A:
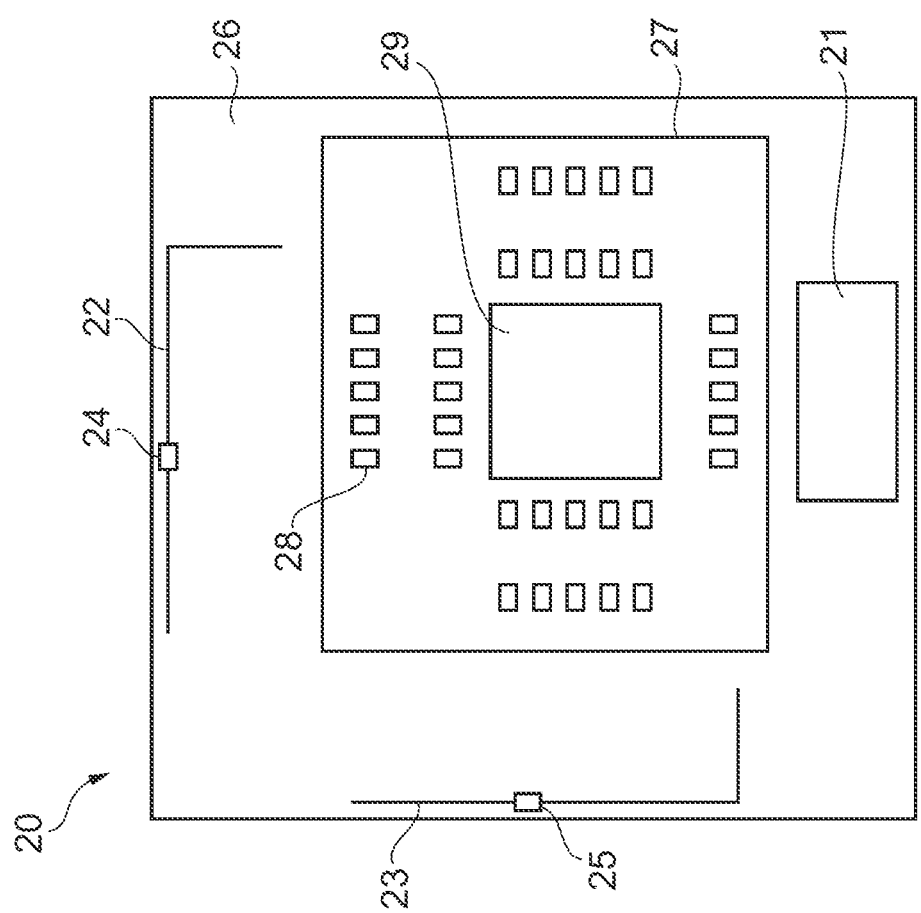

FIG. 3A and FIG. 3B are views schematically showing a configuration of the wireless LAN module 20. The wireless LAN module 20 is constituted by forming a predetermined circuit and by implementing predetermined electronic components on a component implementation surface (a surface) of a small printed substrate 26. Specifically, pattern antennas 22 and 23 are formed on the small printed substrate 26, and inductor chips 24 and 25 are implemented on the pattern antennas 22 and 23. The pattern antennas 22 and 23 are monopole antennas. The pattern antennas 22 and 23 are provided near an edge of the small printed substrate 26 in order to increase efficiency of an input-output characteristic and to prevent interference with the other circuits on the small printed substrate 26.

The inductor chips 24 and 25 are electronic components to secure efficient transmission and reception of radio wave of two frequencies (2.4 GHz and 5 GHz) of the wireless LAN. The inductor chips 24 and 25 reflect the wireless LAN signal of a 5 GHz band and cause resonance to the wireless LAN signal of the 5 GHz band by patterns from roots of the pattern antennas 22 and 23 to the inductor chips 24 and 25. Moreover, the inductor chips 24 and 25 do not reflect the wireless LAN signal of a 2.4 GHz band but cause resonance to the wireless LAN signal of the 2.4 GHz band by patterns from the roots to tips of the pattern antennas 22 and 23.

The USB connector 21 and a wireless LAN control IC 29 are implemented on the small printed substrate 26. The wireless LAN control IC 29 is a semiconductor device that makes the wireless LAN module 20 function as a USB device and executes the wireless communications through the pattern antennas 22 and 23. Moreover, chip components 28, such as capacitors for stabilizing a power source and ground, and resistors for forming a signal waveform, are implemented on the small printed substrate 26 by soldering.

The shielding case 27 consisting of conductor is implemented on the small printed substrate 26 by soldering so as to cover (shield) the wireless LAN control IC 29 and its peripheral circuit (including the chip components 28). This reduces the interference to the wireless communication caused by radiated noise emitted from the wireless LAN control IC 29 and its peripheral circuit.

It should be noted that the shielding case 27 may consist of a frame-shaped base soldered to the small printed substrate 26 and a cover that fits to the base. Since such a configuration eases evaluation of an antenna characteristic by measuring signals of the peripheral circuit before fitting the cover, a shipment test can be performed efficiently.

Figure 4:
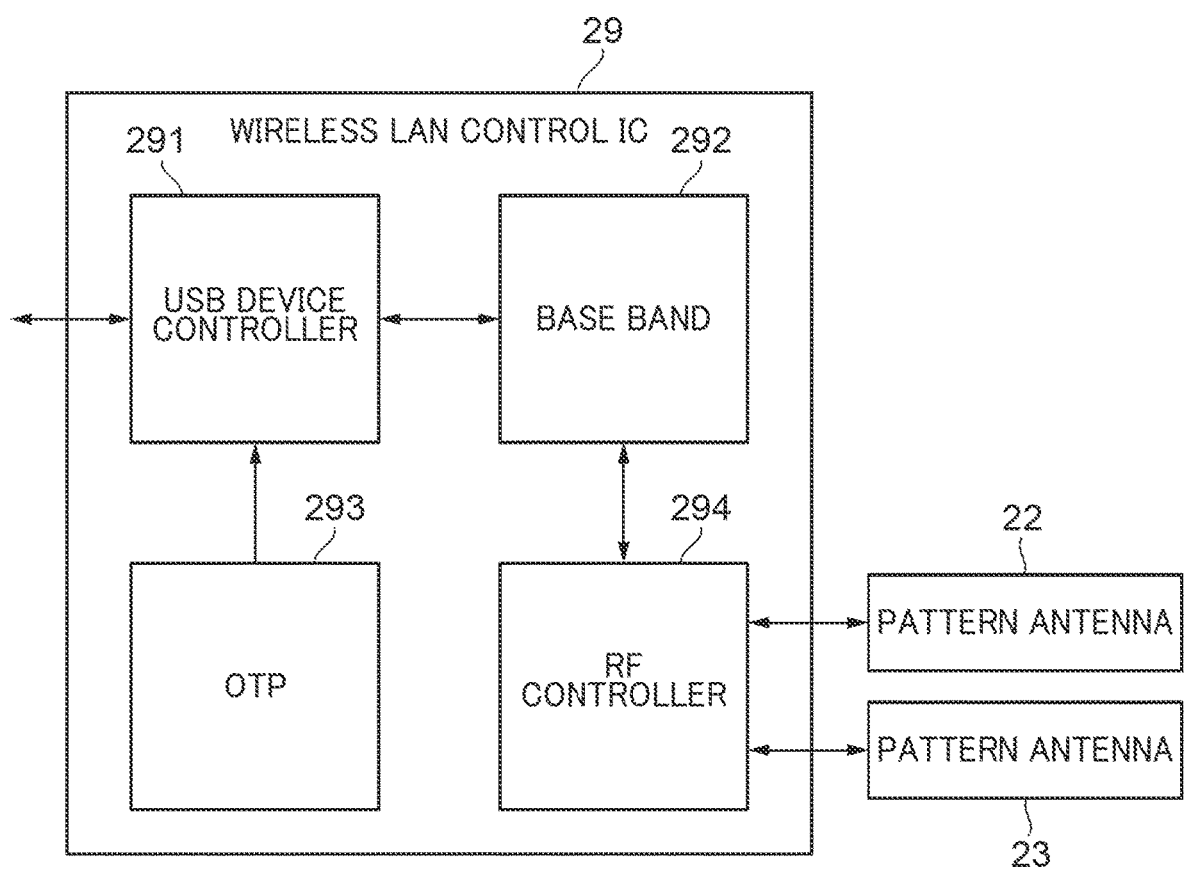
FIG. 4 is a block diagram showing a wireless LAN control IC of the wireless LAN module.

FIG. 4 is a block diagram showing the wireless LAN control IC 29. The wireless LAN control IC 29 has a USB device controller 291, a baseband module 292, an RF controller 294, and an OTP 293 as blocks that control the wireless LAN communication.

The USB device controller 291 controls input and output of data between itself and the controller 10 through the USB cable 3. The USB device controller 291 controls operations of the blocks of the wireless LAN control IC 29 integrally. It should be noted that the USB device controller 291 holds a vendor ID, a product ID, etc., of the USB as information about the wireless LAN control IC 29.

The baseband module 292 controls wireless communication by executing a baseband signal process in the wireless communication on the basis of a wireless communication standard. The RF controller 294 performs a modulation process and a demodulation process of a radio wave for RF communication on the basis of the wireless communication standard in wirelessly communicating with the external wireless LAN access point 50 or the mobile terminal 40.

The OTP 293 is a memory means that consists of a onetime PROM that is a nonvolatile memory. The OTP 293 is a readable and writable memory that permits writing only once and does not permit rewriting of information in the OTP 293. The OTP 293 stores various communication parameters that are set to the baseband module 292 and RF controller 294 at the time of the wireless communication. Moreover, an export country group number as group discrimination information according to a country of an export destination is written in the OTP 293 at the time of shipment of the wireless LAN module 20. It should be noted that writing and reading of information to the OTP 293 are executed by the USB device controller 291.

Figure 5:
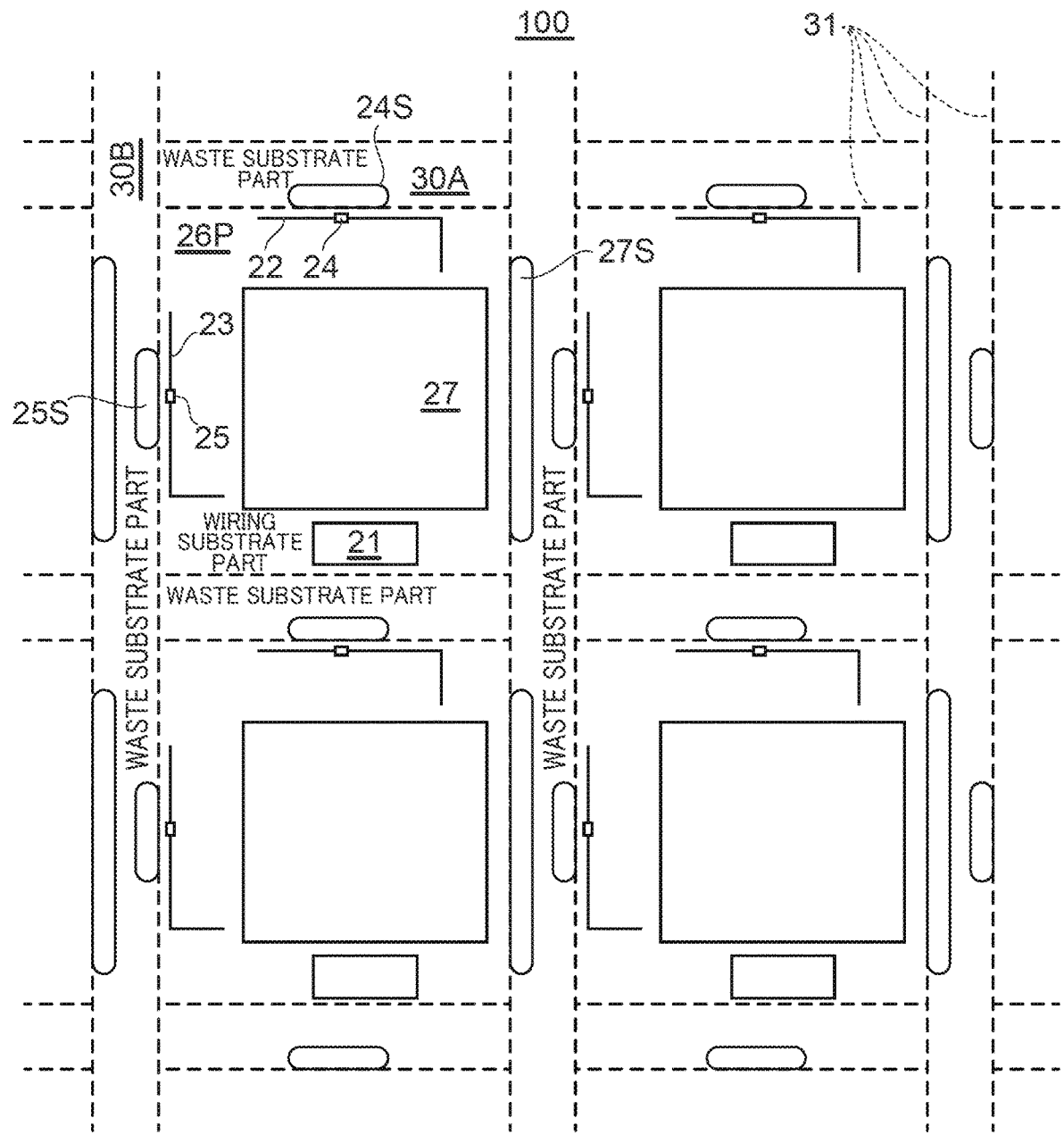
FIG. 5 is a plan view showing a configuration example of a multi-pattern substrate.

Next, a production method of the small printed substrate 26 will be described. FIG. 5 is a plan view showing a configuration of a multi-pattern substrate 100 that has wiring substrate parts 26P and waste substrate parts 30A and 30B. FIG. 6A is a plan view expanding and showing a part of the multi-pattern substrate 100. FIG. 6B is a sectional view showing a configuration of a parting line 31 provided in the multi-pattern substrate 100.

The multi-pattern substrate 100 is integrally formed by the wiring substrate parts 26P and the waste substrate parts 30A and 30B that are partitioned by the parting lines 31A and is a substrate used as a base in manufacturing the wireless LAN module 20. In the multi-pattern substrate 100, the wiring substrate part 26P will become the small printed substrate 26 of the wireless LAN module 20 after substrate cut-off mentioned later.

The pattern antennas 22 and 23 are formed on the respective wiring substrate parts 26P of the multi-pattern substrate 100 before the substrate cut-off And various components, such as the inductor chips 24 and 25 and the wireless LAN control ICs 29, are also implemented on the respective wiring substrate parts 26P before the substrate cut-off. Accordingly, the wiring substrate part 26P has a size suitable for an implement process of various components by soldering and a circuit formation process.

Each of the parting lines 31 is formed on the multi-pattern substrate 100 as a linearly extended groove 32 having an approximately V-shaped section (hereinafter referred to as a "V-shaped groove 32") as shown in FIG. 6B. The wiring substrate parts 26P and the waste substrate parts 30A and 30B are bent by hands or a machine so that the wiring substrate parts 26P and the waste substrate parts 30A and 30B will crack along the parting lines 31. The wireless LAN modules 20 are obtainable as independent products by separating the wiring substrate parts 26P and the waste substrate parts 30A and 30B along the parting lines 31.

Figure 6C:
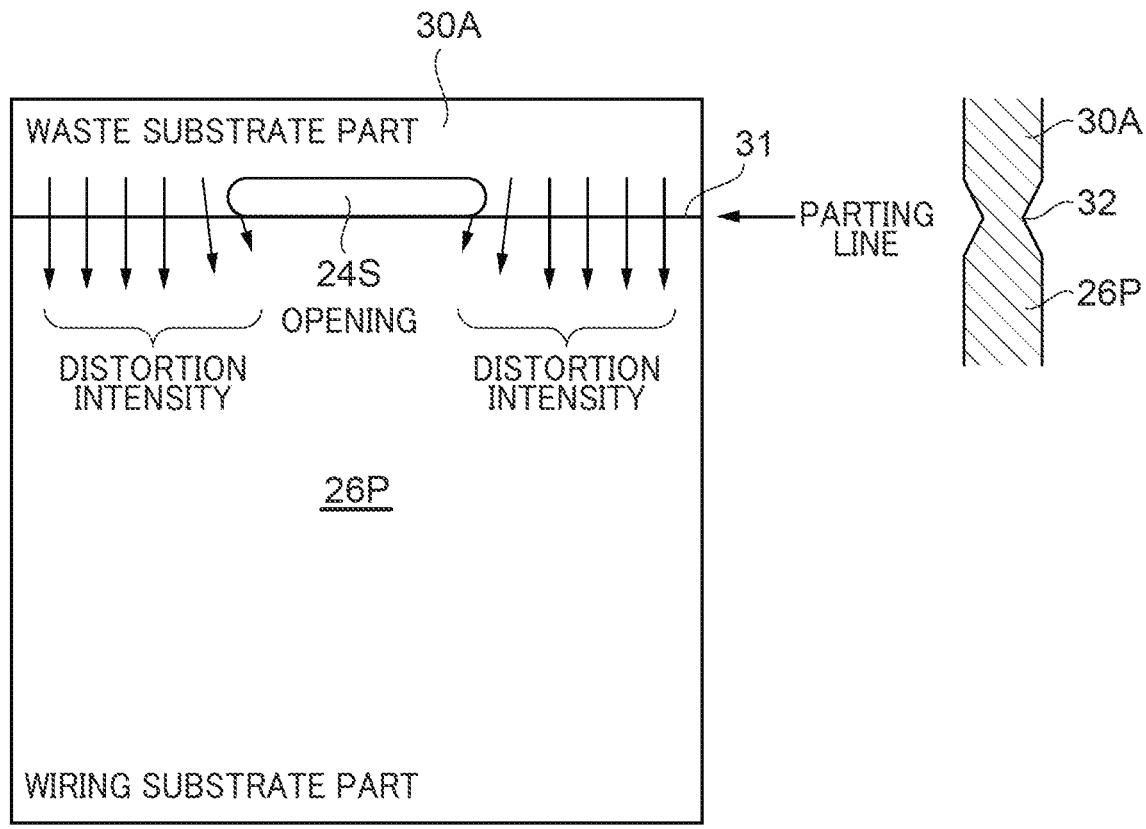
FIG. 6C is a sectional view describing stress applied to the small printed substrate in cutting off the multi-pattern substrate.
Figure 6C:
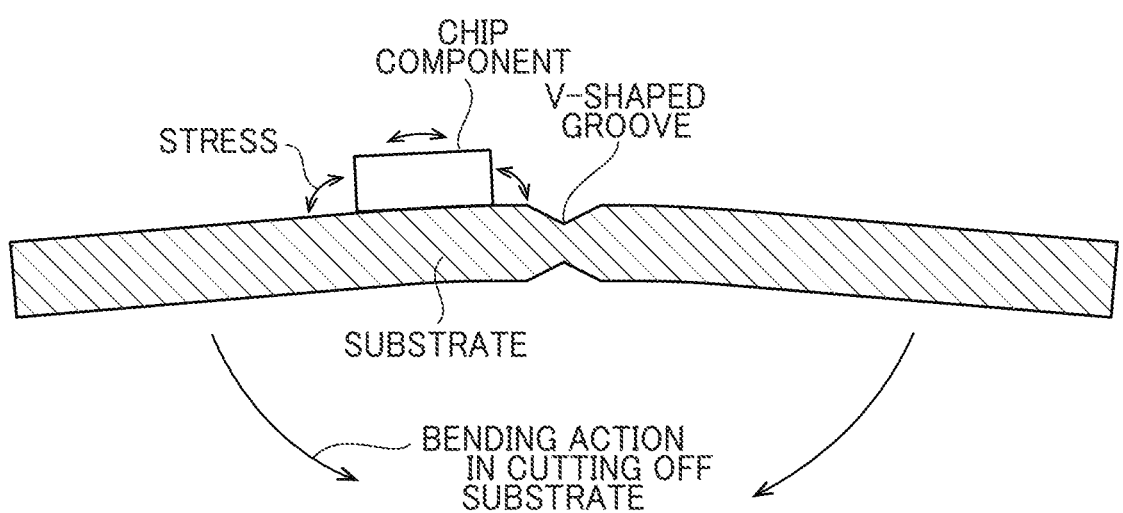

FIG. 6C is a schematic view describing stresses occur in cutting off a general substrate having a V-shaped groove as a parting line and shows a state where the stresses are applied to a chip component implemented near the V-shaped groove in bending the substrate so as to crack along the V-shaped groove. When the substrate is bent to crack along the V-shaped groove, the stress caused by deflection near the V-shaped groove is applied to the chip component implemented on the substrate or to solder that secures the chip component to the substrate. The stress may crack the chip component or may crack the solder that secures the chip component to the substrate. This may cause defective continuity between the chip component and the substrate, which lowers yield. Accordingly, it is necessary to reduce the stress applied to a component soldered to the substrate in cutting off the substrate, to reduce damage of the component, and to reduce exfoliation of the solder in cutting off the substrate.

During the manufacturing process of the wireless LAN module 20, it is necessary to prevent damage and exfoliation of the inductor chips 24 and 25 and the shielding case 27 in cutting off the multi-pattern substrate 100. This issue is common to the above-mentioned configuration where the shielding case 27 consists of the frame-shaped base soldered to the small printed substrate 26 and the cover that fits to the base.

In this embodiment, as shown in FIG. 5, the multi-pattern substrate 100 necessarily includes the waste substrate parts 30A and 30B around the wiring substrate parts 26P. The waste substrate part 30A includes an opening 24S in an area that faces the inductor chip 24 on the wiring substrate part 26P across the parting line 31. The opening 24S includes a part of a slant surface of the V-shaped groove 32 (a slant surface at the side of the waste substrate part 30A) and extends along the V-shaped groove 32. Moreover, the waste substrate part 30B includes an opening 25S in an area that faces the inductor chip 25 on the wiring substrate part 26P across the parting line 31. The opening 25S includes a part of a slant surface of the V-shaped groove 32 (a slant surface at the side of the waste substrate part 30B) and extends along the V-shaped groove 32. Furthermore, the waste substrate part 30B includes an opening 27S in an area that faces the shielding case 27 on the wiring substrate part 26P across the parting line 31. The opening 27S includes a part of the slant surface of the V-shaped groove 32 (the slant surface at the side of the waste substrate part 30B) and extends along the V-shaped groove 32.

The parting lines 31 (V-shaped grooves 32) and the openings 24S, 25S, and 27S are formed beforehand in the multi-pattern substrate 100. Then, the pattern antennas 22 and 23 are formed on the multi-pattern substrate 100, and the inductor chips 24 and 25 and the shielding case 27 are implemented on the multi-pattern substrate 100. After that, the multi-pattern substrate 100 is cut off. In cutting off the substrate, deflection caused by bending the multi-pattern substrate 100 along the parting lines 31 is hardly transferred to the areas (vicinities of the edge of the wiring substrate part 26P) that respectively face the openings 24S, 25S, and 27S across the parting lines 31.

Specifically, the opening 24S formed in the waste substrate part 30A reduces the deflection that occurs around the inductor chip 24 in cutting off the substrate, which takes an effect that prevents damage to the inductor chip 24 and prevents exfoliation of the solder. Moreover, the opening 25S formed in the waste substrate part 30B reduces the deflection that occurs around the inductor chip 25 in cutting off the substrate, which takes an effect that prevents damage to the inductor chip 25 and prevents exfoliation of the solder. Furthermore, the opening 27S formed in the waste substrate part 30B reduces the deflection that occurs around the side of the shielding case 27 near the edge (an outer circumference) of the small printed substrate 26 in cutting off the substrate, which takes an effect that prevents damage to the shielding case 27 and prevents exfoliation of the solder.

In this way, the stresses that are applied to the inductor chips 24 and 25 and to the shielding case 27 described by referring to FIG. 6C are reduced, which prevents breakage and exfoliation of them.

The wireless LAN module 20 that is manufactured as mentioned above is characterized in that at least one side surface of the small printed substrate 26 corresponding to the wiring substrate part 26P includes the following three kinds of surfaces.

A first surface is a mechanical work surface that appears by forming an opening during the manufacture of the multi-pattern substrate 100, and is approximately perpendicular to a component implementation surface (a surface) of the wiring substrate part 26P.

A second surface is a work surface that appears by forming the V-shaped groove 32 during the manufacture of the multi-pattern substrate 100, and is a slant surface of the V-shaped groove 32 at the side of the wiring substrate part 26P. The second surface intersects with the component implementation surface of the small printed substrate 26, the first surface, and a third surface at a predetermined angle. The small printed substrate 26 of the wireless LAN module 20 has the slant face of V-shaped groove 32 over the whole periphery of the component implementation surface.

The third surface is a fracture surface that is connected to the first surface and second surface, and is formed by cracking the multi-pattern substrate 100. The third surface is approximately perpendicular to the component implementation surface of the wiring substrate part 26P.

Figure 7:
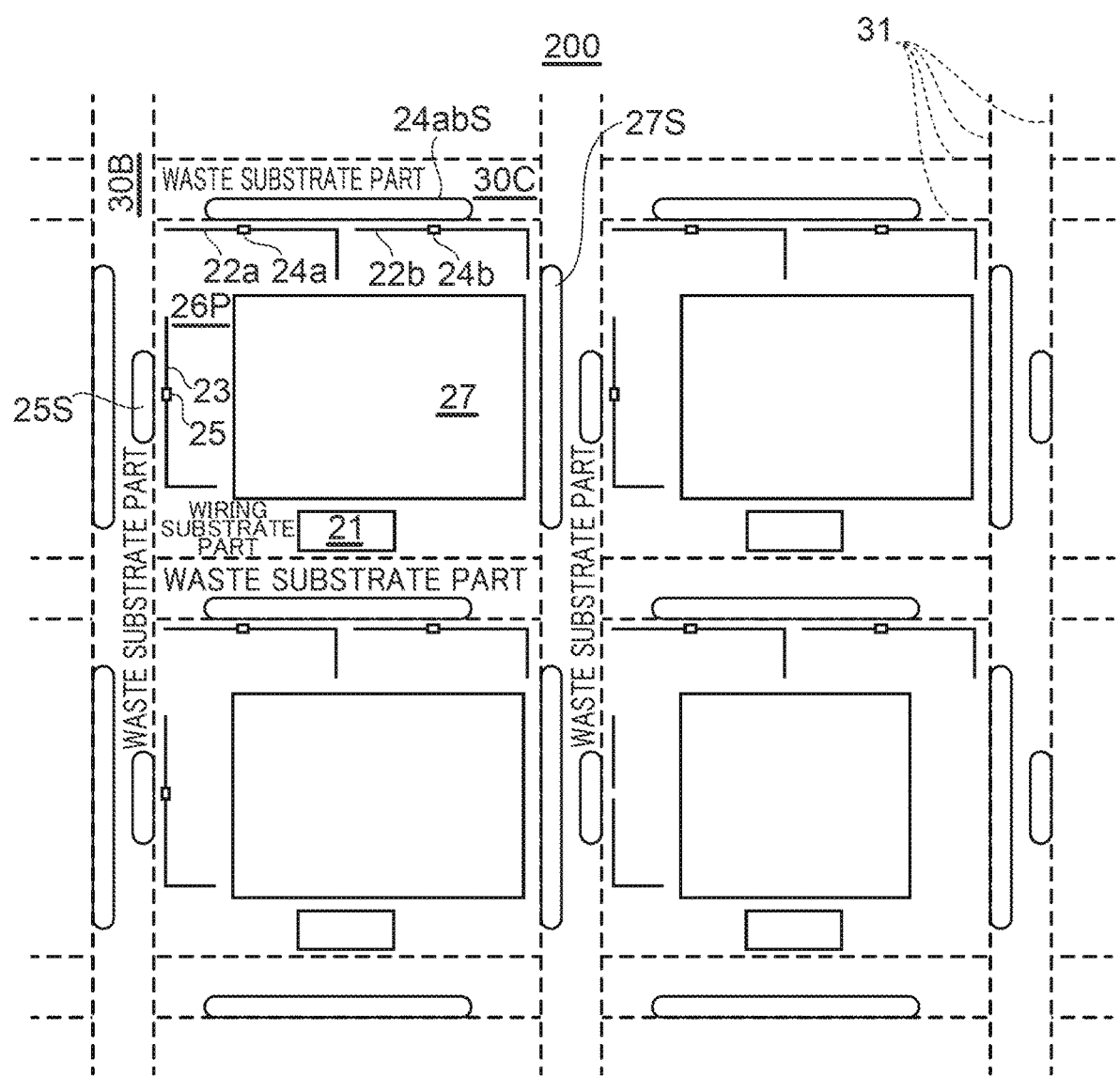
FIG. 7 is a plan view showing another configuration example of a multi-pattern substrate.

FIG. 7 is a plan view showing a configuration of a multi-pattern substrate 200 that has wiring substrate parts 26P and waste substrate parts 30B and 30C. A wireless LAN module constituted by the wiring substrate part 26P included in the multi-pattern substrate 200 is different from the wireless LAN module 20 in that pattern antennas 22*a* and 22*b* are formed along one side and inductor chips 24*a* and 24*b* are respectively implemented on the pattern antennas 22*a* and 22*b*. In taking out the wireless LAN module by cutting off the multi-pattern substrate 200, it is necessary not to apply stresses to the inductor chips 24*a* and 24*b*. Accordingly, an opening 24*ab*S is formed in the waste substrate part 30C in an area that faces the inductor chips 24*a* and 24*b* across the parting line 31. In this way, a size of an opening formed in the waste substrate part may be set depending on the number and sizes of components of which damage and exfoliation of solder should be prevented.

Although the present invention has been described in detail on the basis of the suitable embodiments, the present invention is not limited to these specific embodiments, and various configurations that do not deviate from the scope of the present invention are also included in the present invention. Furthermore, each embodiment mentioned above shows one embodiment of the present invention, and the embodiments can be combined suitably.

Although the above-mentioned embodiment is described by applying the present invention to the functional module that performs wireless communication, this configuration is not limiting. For example, the present invention is applicable to various function modules in which an electronic component is implemented near an edge (an outer circumference) according to a requirement of a miniaturization of a printed circuit board.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-045408, filed Mar. 22, 2022, which is hereby incorporated by reference herein in its entirety.

What is claimed is:

1. A multi-pattern substrate comprising:
   wiring substrate parts; and
   waste substrate parts provided around the wiring substrate parts integrally,
   wherein openings are provided in the waste substrate parts in areas that face components implemented near outer circumferences of the wiring substrate parts, and
   wherein the components are inductor chips that form pattern antennas used for wireless communication.

2. The multi-pattern substrate according to claim 1, wherein linear grooves having an approximately V-shaped section are provided between the wiring substrate parts and the waste substrate parts, and
   wherein each of the openings includes a part of a corresponding linear groove among the linear grooves and is formed along the corresponding linear groove.

3. The multi-pattern substrate according to claim 2, wherein a length of each of the openings along the corresponding linear groove is longer than a length of each of the components along the corresponding linear groove.

4. The multi-pattern substrate according to claim 1, further comprising shielding cases that shield predetermined electronic components implemented in the wiring substrate parts.

* * * * *